(12) United States Patent
Kim

(10) Patent No.: US 6,699,768 B2
(45) Date of Patent: Mar. 2, 2004

(54) METHOD FOR FORMING CAPACITOR OF SEMICONDUCTOR DEVICE

(75) Inventor: Kyong Min Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 5 days.

(21) Appl. No.: 10/315,403

(22) Filed: Dec. 10, 2002

(65) Prior Publication Data

US 2003/0109135 A1 Jun. 12, 2003

(30) Foreign Application Priority Data

Dec. 10, 2001 (KR) .................................. 2001-77851

(51) Int. Cl.$^7$ .......................................... H01L 21/8242
(52) U.S. Cl. ........................ 438/396; 438/244; 438/660; 438/768
(58) Field of Search .................. 438/244, 396, 438/660, 768, FOR 212, FOR 220; 148/DIG. 14

(56) References Cited

U.S. PATENT DOCUMENTS

| | | | |
|---|---|---|---|
| 5,739,049 A | | 4/1998 | Park et al. |
| 5,741,722 A | * | 4/1998 | Lee .............................. 438/240 |
| 6,218,256 B1 | | 4/2001 | Agarwal |
| 6,235,572 B1 | | 5/2001 | Kunitomo et al. |
| 6,436,723 B1 | * | 8/2002 | Tomita et al. .................. 438/3 |
| 2001/0000923 A1 | * | 5/2001 | Takemura .................... 257/532 |
| 2001/0016382 A1 | * | 8/2001 | Song et al. ................. 438/240 |
| 2002/0028556 A1 | * | 3/2002 | Marsh et al. ................ 438/299 |
| 2003/0036242 A1 | * | 2/2003 | Yang .......................... 438/396 |

* cited by examiner

*Primary Examiner*—George Fourson
*Assistant Examiner*—Joannie Adelle Garcia
(74) *Attorney, Agent, or Firm*—Marshall, Gerstein & Borun LLP

(57) ABSTRACT

Methods for forming capacitors of semiconductor devices are disclosed, and more particularly, methods for forming capacitors having a stacked structure of metal layer-insulating film-metal layer and having its storage electrode formed of ruthenium (hereinafter, referred to as 'Ru'), which provides improved formation rates of Ru film having desired thickness using ozone ($O_3$) having high reactivity.

12 Claims, 2 Drawing Sheets

METHOD FOR FORMING CAPACITOR OF SEMICONDUCTOR DEVICE

BACKGROUND

1. Technical Field

Methods for forming capacitors of semiconductor devices, and more particularly, methods for forming capacitors are disclosed wherein the capacitors have a stacked structure of metal layer-insulating film-metal layer and having its storage electrode formed of ruthenium (hereinafter, referred to as "Ru"), which provides improved formation rates of the Ru film having desired thickness using ozone ($O_3$) having high reactivity.

2. Description of the Related Art

Generally, during the fabrication processed a capacitor having a storage electrode formed of Ru film, $O_2$ gas is used as reaction gas of source materials for Ru films at a temperature ranging from 200 to 260° C.

However, when Ru films are formed at the above temperature, oxygen or carbon atoms from the reaction gas penetrate into the Ru films. As a result, the Ru films become unstable.

In addition, in the subsequent process of forming dielectric films using tantalum oxide ($Ta_2O_5$), the oxygen atoms oxidize the TiN film used as lower barrier metal layer, which results in double capacitors or lifted-off of the storage electrodes formed of Ru.

In order to overcome the above problem, the oxygen is deoxidized to decrease the number of oxygen atoms penetrating into the Ru films during the fabrication process of Ru films, which results in prevention of the barrier metal layers being oxidized.

Any amine gas or its derivatives can be used as the reaction gas to deoxidize oxygen. When ammonia ($NH_3$) gas is injected, the reaction mechanism is as follows:

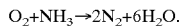

$$O_2 + NH_3 \rightarrow 2N_2 + 6H_2O.$$

However, since the reaction rate of the $NH_3$ gas and oxygen gas is faster than that of the source material for Ru film and oxygen gas, decomposition of the source material for Ru film is inhibited and the formation rate of Ru film is reduced.

For example, when Ru film is formed at a thickness ranging from 100 to 500 Å, with 0.01 to 1 cc/min of source material for Ru film, 10 to 100 sccm of oxygen gas and 100 to 1000 sccm of ammonia gas, formation time is increased from 10 to 30 minutes, thereby reducing the formation rate.

When the amount of oxygen gas in the reaction gas is increased to increase the formation rate of Ru films, step coverage is degraded and overhang occurs. In addition, the density of Ru film is decreased compared to Ru film only formed of Ru due to penetration of a large amount of oxygen atoms into Ru films. The oxygen atoms penetrated into Ru film also oxidize barrier metal layers during the subsequent heat treatment process, thereby deteriorating yield and characteristics of devices.

The above-described problems still exist even though the formation process of Ru films is performed at over 270° C., and they are even more intensified when the amount of oxygen gas is decreased.

SUMMARY OF THE DISCLOSURE

Improved methods for forming capacitors of semiconductor devices are disclosed wherein ozone gas having high reactivity is used as reaction gas during the formation process of Ru films to prevent reduction of the formation rate and the density of the Ru films and to further prevent oxidation of the barrier metal layer.

One disclosed method comprises:

- forming a lower insulating layer comprising a contact plug including a barrier metal layer on a semiconductor substrate;
- forming a Ru film electrically connected to the contact plug using $O_3$ gas at a temperature ranging from about 300 to 350° C.;
- forming a dielectric film on the Ru film;
- thermally treating the dielectric film; and
- forming a plate electrode on the dielectric film.

It is preferable that the Ru film is used for storage electrodes.

It is preferable that the barrier metal layer comprises TiN.

It is preferable that the step of forming the Ru film is performed in amine gas atmosphere or selectively argon gas atmosphere.

It is preferable that the Ru film is performed using a material selected from the group consisting of tris(2,4-octanedionato)ruthenium, bis(ethylcyclopentadienyl) ruthenium [Ru(Etcp)$_2$], (1,3-cyclohexadiene)ruthenium and combinations thereof as a source material for the Ru film.

It is preferable that the dielectric film, tantalum oxide material, is formed of tantalum ethylate [TA(OC$_2$H$_5$)$_5$]. Here, the dielectric film is selected from the group consisting of BST((BaSr)TiO$_3$) layer, PZT(PbZrTiO$_3$) layer, SBT (SrBi$_2$Ta$_2$O$_9$) layer, BLT(Bi$_{(4-x)}$La$_x$Ti$_3$O$_{12}$) layer, and combinations thereof.

DETAILED DESCRIPTION OF THE PRESENTLY PREFERRED EMBODIMENTS

Methods for forming capacitors of semiconductor devices will now be described in more detail in reference to the accompanying drawings.

FIGS. 1a through 1d are cross-sectional diagrams illustrating method for forming capacitor of semiconductor device in accordance with a preferred embodiment of the present invention, wherein the capacitor is a concave type capacitor.

Figure 1A:
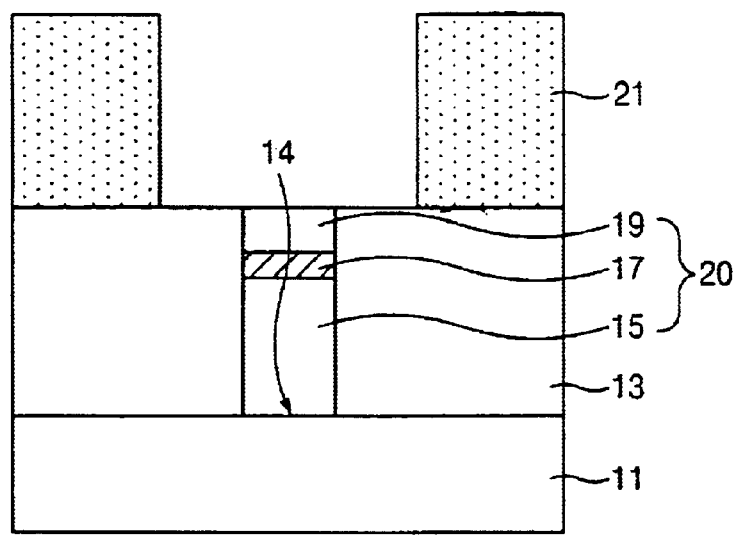
FIGS. 1a through 1d are cross-sectional diagrams illustrating method for forming capacitor of semiconductor device according to the disclosed processes.

Referring to FIG. 1a, a lower insulating layer 13 is formed on a semiconductor substrate 11.

The lower insulating layer 13 is formed on the substrate 11 which comprises a device isolation film (not shown), a word line (not shown) and a bit line (not shown), and has a planarized top surface.

The lower insulating layer 13 comprises insulating materials having high fluidity such as BPSG (borophosphosilicate glass), PSG (phosphosilicate glass), FSG (fluorosilicate glass), PE-TEOS (plasma enhanced tetraethoxysilicate glass), PE-SiH$_4$ (plasma enhanced-silane), HDP USG (high density plasma undoped silicate glass) and HDP PSG (high density plasma phosphosilicate glass).

Thereafter, the lower insulating layer 13 is etched via a photo-etching process using a storage electrode contact mask to form a storage electrode contact hole 14 which exposes a predetermined portion of the substrate 11.

A contact plug 20 comprising a stacked structure of a polysilicon film 15, a Ti film 17 and a TiN film 19 is formed to fill the storage electrode contact hole 14.

Specifically, the stacked structure is formed by first forming a polysilicon film (not shown) having a thickness ranging from about 200 to about 300 Å to fill the whole electrode contact hole 14 and then planarizing and over-etching to remove a top portion of the polysilicon film in the contact hole 14. Secondly, a Ti film (not shown) having a thickness ranging from about 100 to about 500 Å is formed thereon and then over-etched. Thirdly, a TiN film (not shown) having a thickness ranging from about 100 to about 500 Å is formed thereon and then planarized.

The planarization process is performed by utilizing differences in etching selectivity between the polysilicon film (not shown), the Ti layer (not shown) and the TiN layer (not shown) and the lower insulating layer 13.

Figure 1B:
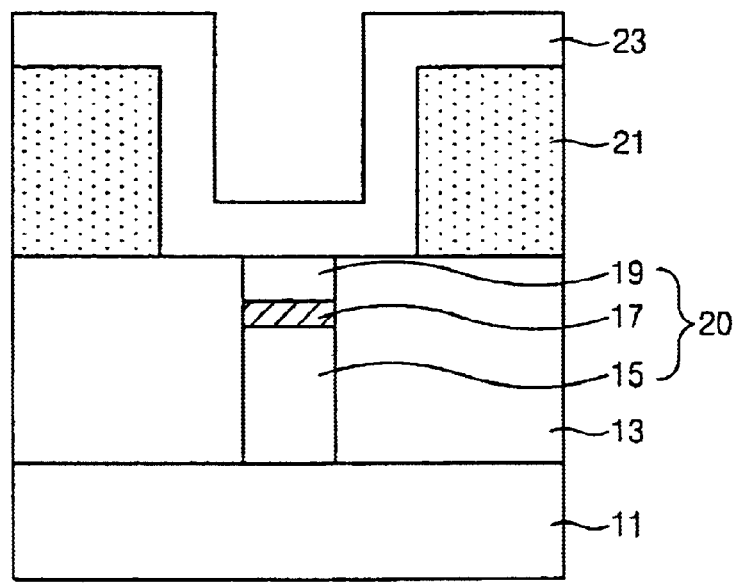

Referring to FIG. 1b, a sacrificial insulating film 21 comprising PE-TEOS or PSG is formed on the resultant structure including the lower insulating layer 13. The sacrificial insulating layer is etched via photo-etching process using a storage electrode mask to form the sacrificial insulating film 21 pattern which exposes top portions of contact plug 20.

Thereafter, a Ru film 23 is formed on the whole surface of the resultant structure using $O_3$ gas.

The formation process of the Ru film is performed at a wafer temperature ranging from about 300 to about 350° C. and a reaction chamber pressure ranging from about 0.1 to about 5 torr by injecting Ru source material in gas state, such as tris(2,4-octanedionato)ruthenium in gas state, having flow rate ranging from about 0.2 to about 1.0 cc/min, $O_3$ reaction gas having concentration ranging from about 10 to about 1000 g/m$^3$(ppm), $NH_3$ reaction gas ranging from about 10 to about 500 sccm and Ar gas ranging from about 500 to about 1000 sccm to obtain the Ru film 23 having a thickness ranging from about 100 to about 500 Å.

The $O_3$ gas allows the Ru film to be formed in a short time (about 20 minutes) with small amount due to its high reactivity in decomposing the source material for Ru film.

Figure 1C:
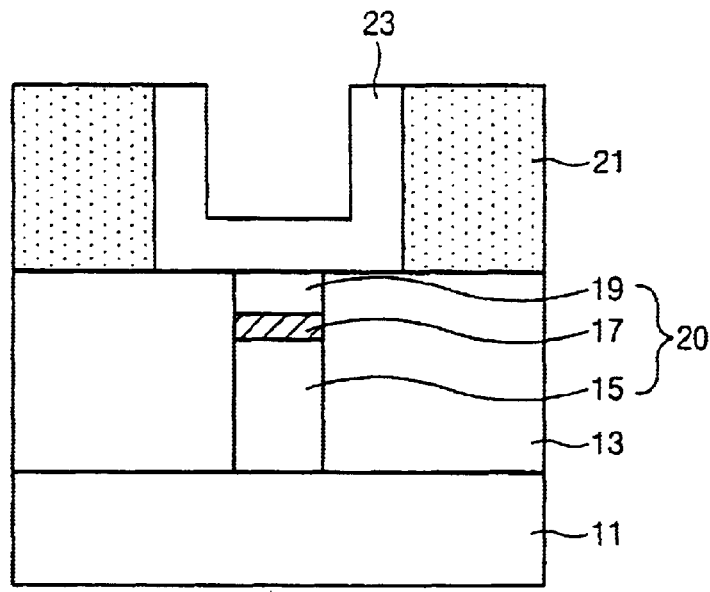

Referring to FIG. 1c, after filling the storage electrode region with photosensitive films, CMP process is performed to remove the Ru film 23 on the top portion of the sacrificial insulating film 21, thereby leaving the Ru film 23 only on the lower portion and the side wall of the storage electrode region to form a storage electrode.

Figure 1D:
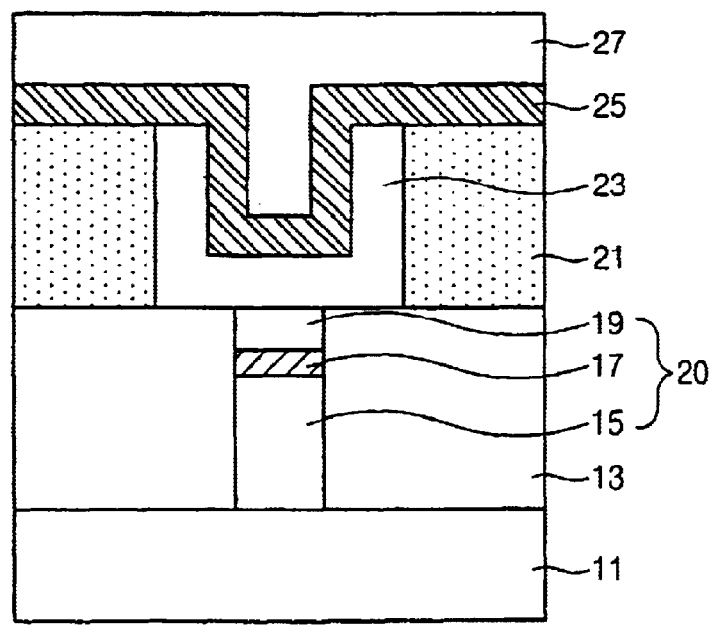

Referring to FIG. 1d, a tantalum oxide film 25 which is a dielectric film and a plate electrode 27 which is a top electrode comprising TiN or Ru are sequentially formed on the resultant structure.

It is preferable that the tantalum oxide film is formed using tantalum ethylate as source material.

The process of forming the tantalum oxide film is performed at a wafer temperature ranging from about 350 to about 450° C. and a reaction chamber pressure ranging from about 0.1 to about 1.2 torr, by injecting Ru source material in gas state vaporized in a vaporizer having a temperature ranging from about 170 to about 190° C. and flow rate ranging from about 0.006 to about 0.36 cc/min, and flow rate of $O_2$ reaction gas ranging from 10 to 1000 sccm.

Low temperature thermal treatment processes such as $N_2+O_2$ plasma treatment, $N_2O$ plasma treatment or $UV/O_3$ plasma treatment are performed on the tantalum oxide film 27 at a wafer temperature ranging from about 300 to about 500° C.

It is preferable that RTP (rapid thermal processing) or furnace annealings are performed on the tantalum oxide film (27) under the $N_2$ and $O_2$ gas atmosphere at a temperature ranging from about 500 to about 700° C. for a time period ranging from about 1 to about 5 minutes.

Additionally, the storage electrode of the present invention is formed having a concave type or other three dimensional structures.

As described earlier, a method for forming capacitor of semiconductor device is disclosed which uses $O_3$ gas as reaction gas when the Ru films are formed.

The Ru film is formed with small amounts of $O_3$ due to the $O_3$ gas having high reactivity. As a result, penetration of oxygen atoms into Ru film due to decrease in usage of $O_3$ can be prevented.

In addition, the amount of amine gas or its derivative used to deoxidize the oxygen gas is reduced, which results in inhibition of decomposition of source material for Ru film due to ammonia gas is prevented and increase the formation rate of forming Ru film is increased.

In addition, due to the decrease in amount of oxygen reaction gas, the amount of oxygen atoms remaining in Ru films is decreased, thereby preventing oxidation of barrier metal layers during the subsequent heat treatment process for forming tantalum oxide films.

As a result, Ru film formed even at the above reaction temperature has excellent step coverage and electric characteristics.

What is claimed is:

1. A method for forming a capacitor of a semiconductor device comprising:
    forming a lower insulating film comprising a contact plug including a barrier metal layer on a semiconductor substrate;
    forming a Ru film electrically connected to the contact plug using $O_3$ gas in an amine gas atmosphere and an argon gas atmosphere and at a temperature ranging from 300 to 350° C.;
    forming a dielectric film on the Ru film;
    thermally treating the dielectric film; and
    forming a plate electrode on the dielectric film.

2. The method according to claim 1, wherein the barrier metal layer comprises titanium nitride (TiN).

3. The method according to claim 1, wherein the step of forming the Ru film is performed using a material selected from the group consisting of tris(2,4-octanedionato) ruthenium, bis(ethylcyclopentadienyl)ruthenium [Ru(Etcp)$_2$], (1,3-cyclohexadiene)ruthenium and combinations thereof as a source material for the Ru film.

4. The method according to claim 1, wherein the step of forming the Ru film is performed at a wafer temperature ranging from 300 to 350° C., and under a reaction chamber pressure ranging from 0.1 to 5 Torr by injecting vaporized gas of Ru source material having a flow rate ranging from 0.2 to 1.0 cc/min.

5. The method according to claim 1, wherein the step of forming the Ru film is performed by injecting $O_3$ gas having a concentration ranging from 10 to 1000 g/m$^3$, and $NH_3$ gas having a flow rate ranging from 10 to 500 sccm and Ar gas having a flow rate ranging from 500 to 1000 sccm.

6. The method according to claim 1, wherein the Ru film has a thickness ranging from 100 to 500 Å.

7. The method according to claim 1, wherein the dielectric film comprise a tantalum oxide film.

8. The method according to claim 1, wherein the dielectric film is selected from the group consisting of a BST((BaSr)TiO$_3$) layer, a PZT(PbZrTiO$_3$) layer, a SBT(SrBi$_2$Ta$_2$O$_9$)

layer, a BLT($Bi_{(4-x)}La_xTi_3O_{12}$) layer and combinations thereof.

9. The method according to claim 1, wherein the step of forming the dielectric film is performed at a wafer temperature ranging from 350 to 450° C. and under a reaction chamber pressure ranging from 0.1 to 1.2 Torr by injecting a source material having a flow rate ranging from 0.006 to 0.36 cc/min vaporized in a vaporizer at a temperature ranging from 170 to 190° C.

10. The method according to claim 1, wherein the step of forming the dielectric film is performed by injecting $O_2$ gas having a flow rate ranging from 10 to 1000 sccm.

11. The method according to claim 1, wherein the step of thermally treating the dielectric film is a process selected from the group consisting of $N_2$ and $O_2$ plasma treatment, a $N_2O$ plasma treatment and a $UV/O_3$ treatment performed at a temperature ranging from 300 to 500° C.

12. The method according to claim 1, wherein the step of thermally treating the dielectric film is performed by a RTP annealing or furnace annealing process under a $N_2$ or an $O_2$ atmosphere at a temperature ranging from 500 to 700° C.

* * * * *

UNITED STATES PATENT AND TRADEMARK OFFICE
CERTIFICATE OF CORRECTION

PATENT NO. : 6,699,768 B2 Page 1 of 1
APPLICATION NO. : 10/315403
DATED : March 2, 2004
INVENTOR(S) : Kyong Min Kim It is certified that error appears in the above-identified patent and that said Letters Patent is hereby corrected as shown below:

Column 4, Claim 7, Line 64
    After "film," please delete "comprise"
    and insert -- comprises -- in its place.

Column 6, Claim 11, Line 3
    After "the group," please delete "consisting of $N_2$"
    and insert -- consisting of a $N_2$ -- in its place.

Signed and Sealed this

Twenty-ninth Day of January, 2008

JON W. DUDAS
*Director of the United States Patent and Trademark Office*